US012765122B2

(12) United States Patent
Chen et al.

(10) Patent No.: US 12,765,122 B2
(45) Date of Patent: Oct. 13, 2026

(54) DISPLAY PANEL AND MANUFACTURING METHOD THEREOF

(71) Applicant: Shenzhen China Star Optoelectronics Semiconductor Display Technology Co., Ltd., Shenzhen (CN)

(72) Inventors: Hao Chen, Shenzhen (CN); Rui Zhao, Shenzhen (CN); Weiji Zhang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 406 days.

(21) Appl. No.: 18/522,490

(22) Filed: Nov. 29, 2023

(65) Prior Publication Data

US 2025/0048790 A1 Feb. 6, 2025

(30) Foreign Application Priority Data

Aug. 3, 2023 (CN) ......................... 202310978505.4

(51) Int. Cl.
*H10H 20/819* (2025.01)
*H10H 29/14* (2025.01)
*H10W 90/00* (2026.01)

(52) U.S. Cl.
CPC ........ *H10H 20/819* (2025.01); *H10H 29/142* (2025.01); *H10W 90/00* (2026.01)

(58) Field of Classification Search
CPC .. H10H 20/819; H10H 29/142; H10H 29/012; H10H 29/03; H10H 29/034; H10H 29/30; H10H 29/842; H10H 29/8508; H10H 20/85; H10H 20/8506; H10H 20/036; H10W 90/00; H10K 59/121; H10K 77/111; H10K 2102/311; G09F 9/301; G09F 9/03
See application file for complete search history.

(56) References Cited

U.S. PATENT DOCUMENTS

| | | | | |
|---|---|---|---|---|
| 2017/0357289 | A1* | 12/2017 | Ahn | B32B 27/36 |
| 2018/0130974 | A1* | 5/2018 | Koo | G02F 1/133345 |
| 2019/0305235 | A1* | 10/2019 | Hsieh | H10K 77/111 |
| 2020/0052045 | A1* | 2/2020 | Kuo | H10K 59/35 |

* cited by examiner

*Primary Examiner* — Yasser A Abdelaziez

(57) ABSTRACT

A display panel and manufacturing method thereof are provided. The display panel includes a first display area and a second display area surrounding the first display area. The display panel includes: a first substrate, including base islands; light-emitting elements arranged on the first substrate; and a second substrate set on the light-emitting elements. The second substrate includes grooves arranged in the first display area. These grooves can increase the elasticity and stretchability of the second substrate in the first display area, making a stretch film in this area more easily stretchable and deformable, reducing stress concentration. This design aims to prevent excessive force and deformation in a middle part when the display panel is stretched upwards, thus minimizing stress concentration in this area. By allowing a smoother stretch in the first display area, it prevents issues of uneven display effects and abnormal screen problems.

10 Claims, 4 Drawing Sheets

DISPLAY PANEL AND MANUFACTURING METHOD THEREOF

RELATED APPLICATION

This application claims the benefit of priority of China Patent Application No. 202310978505.4 filed on Aug. 3, 2023, the contents of which are all incorporated by reference as if fully set forth herein in their entirety.

FIELD OF DISCLOSURE

The present application relates to a field of display, and specifically to a display panel and a manufacturing method thereof.

DESCRIPTION OF RELATED ART

Display panels have been widely used in everyday life, such as in the screens of mobile phones, computers, etc. With the rapid development of the display panel industry, stretchable display panels are being progressively developed.

However, stretchable display panels face a challenge when being stretched upwards: due to greater force being exerted on a central part and less force on edge parts, a stretch film in the central part undergoes greater deformation compared to the smaller deformation at the edges. This leads to uneven display effects and abnormal screen issues.

SUMMARY OF INVENTION

This embodiments of the application provide a display panel and a manufacturing method of the display panel that can solve the problem of uneven display effects and abnormal screen issues caused by greater deformation in a central part and lesser deformation at edges during the upward stretching of stretchable display panels.

The present application provides a display panel, including a first display area and a second display area surrounding the first display area, the display panel including:

- a first substrate including a plurality of base islands;
- a plurality of light-emitting elements disposed on the first substrate; and
- a second substrate disposed on the light-emitting elements;
- wherein the second substrate includes a plurality of grooves, and the grooves are arranged in the first display area.

Optionally, in some embodiments of the present application, the grooves comprise a plurality of first grooves, and the first grooves are defined in a surface of the second substrate facing the light-emitting elements.

Optionally, in some embodiments of the present application, the grooves further comprise a plurality of second grooves, and the second grooves are defined in a surface of the second substrate away from the light-emitting elements.

Optionally, in some embodiments of the present application, the first grooves and the second grooves overlap in a thickness direction of the second substrate.

Optionally, in some embodiments of the present application, a shape of each of the first grooves is same as a shape of a corresponding one of the second grooves.

Optionally, in some embodiments of the present application, a length of each of the grooves is less than a length of each of the light-emitting elements along a horizontal direction parallel to a plane surface of the display panel.

Optionally, in some embodiments of the present application, a depth of each of the grooves ranges from 1 to 10 micrometers.

Optionally, in some embodiments of the present application, in a top view, a shape of the groove is at least one of a rectangle, a rhombus, a circle, a semicircle, and a triangle.

Accordingly, the present application further provides a manufacturing method of a display panel, including:

- providing a rigid substrate;
- providing a first substrate, positioning the first substrate on the rigid substrate, wherein the first substrate including a plurality of base islands;
- providing a plurality of light-emitting elements and transferring the light-emitting elements to the first substrate;
- providing a second substrate and attaching the second substrate to the light-emitting elements, wherein the display panel includes a first display area and a second display area surrounding the first display area, the second substrate includes a plurality of grooves, and the grooves are arranged in the first display area; and
- peeling off the first substrate from the rigid substrate.

Optionally, in some embodiments of the present application, a length of each of the grooves is smaller than a length of each of the light-emitting elements along a horizontal direction parallel to a plane surface of the display panel.

In the embodiments of the present application, a display panel and a manufacturing method thereof are provided. The display panel includes a first display area and a second display area surrounding the first display area. The display panel includes: a first substrate, including a plurality of base islands; a plurality of light-emitting elements, arranged on the first substrate; and a second substrate, set on the light-emitting elements. The second substrate includes a plurality of grooves which are positioned in the first display area. In this application, the grooves are set in the first display area (a central part) of the second substrate (a stretch film). These grooves can increase the elasticity and stretchability of the second substrate in the first display area, making the stretch film in this area more easily stretchable and deformable, and reducing stress concentration. This design aims to prevent excessive force and deformation in the central part when the display panel is stretched upwards, thus minimizing stress concentration in this area. By allowing a smoother stretch in the first display area, it improves and prevents issues of uneven display effects and abnormal screen problems.

BRIEF DESCRIPTION OF DRAWINGS

To more clearly illustrate the technical solutions in the embodiments of this application, the drawings used in the description of the embodiments will be briefly introduced below. It is evident that the drawings described below are only some embodiments of this application, and for those skilled in the art, other drawings can be obtained from these drawings without creative efforts.

DETAILED DESCRIPTION OF EMBODIMENTS

Figure 1:
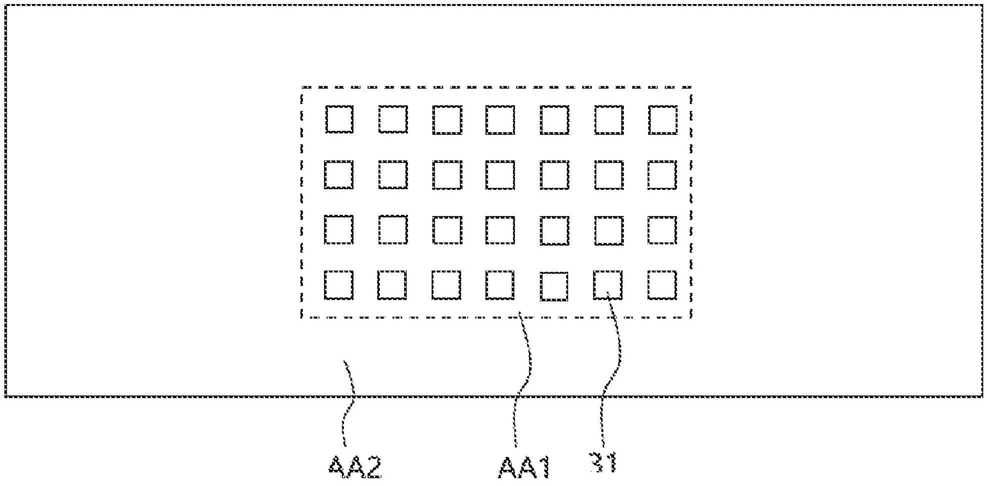
FIG. 1 is a schematic top view of a second substrate of a display panel according to a first embodiment of the present application.

The technical solutions in the embodiments of this application are clearly and completely described in conjunction with the drawings in the embodiments of this application. Obviously, the described embodiments are only a part of the embodiments of this application, and not all embodiments. Based on the embodiments in this application, all other embodiments obtained by those skilled in the art without creative efforts should fall within the scope of this application's protection. In addition, it should be understood that the specific embodiments described here are only used to explain and illustrate this application and are not intended to limit this application. In this application, unless otherwise stated, orientation words used such as "up" and "down" typically refer to the up and down in the actual use or working state of the device, specifically the direction of the image in the drawings; "inside" and "outside" refer to the outline of the device.

This application provides a display panel, which includes a first display area and a second display area surrounding the first display area. The display panel includes: a first substrate including a plurality of base islands; a plurality of light-emitting elements set on the first substrate; and a second substrate set on the light-emitting elements. The second substrate includes a plurality of grooves, and the grooves are arranged in the first display area.

This application also provides a manufacturing method for the aforementioned display panel. A detailed explanation is provided below. It should be noted that the description order of the following embodiments does not limit the preferred order of the embodiments.

First Embodiment

Figure 2:
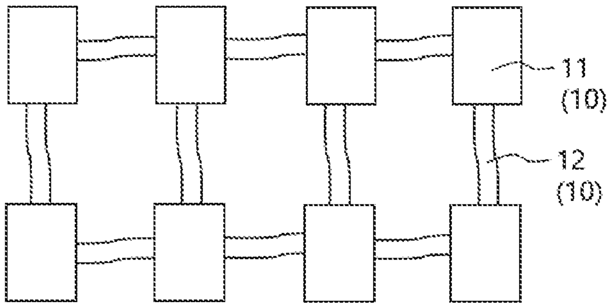
FIG. 2 is a schematic top view of a first substrate of the display panel provided in the first embodiment of the present application.
Figure 3:
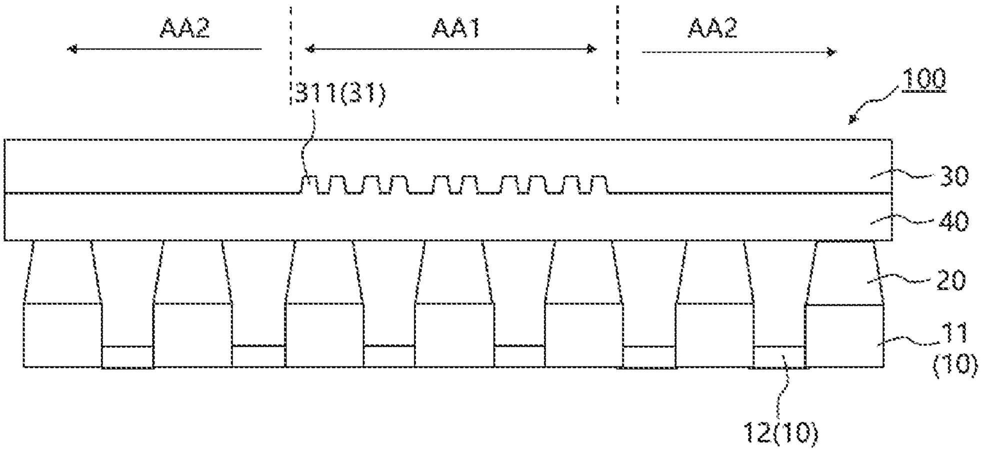
FIG. 3 is a schematic view illustrating a first cross-sectional structure of the display panel provided in the first embodiment of the present application.
Figure 4:
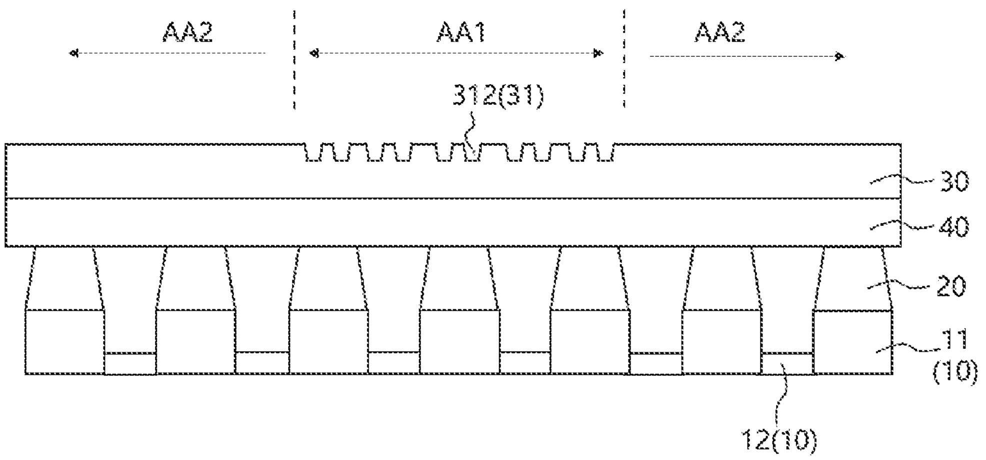
FIG. 4 is a schematic view illustrating a second cross-sectional structure of the display panel provided in the first embodiment of the present application.
Figure 5:
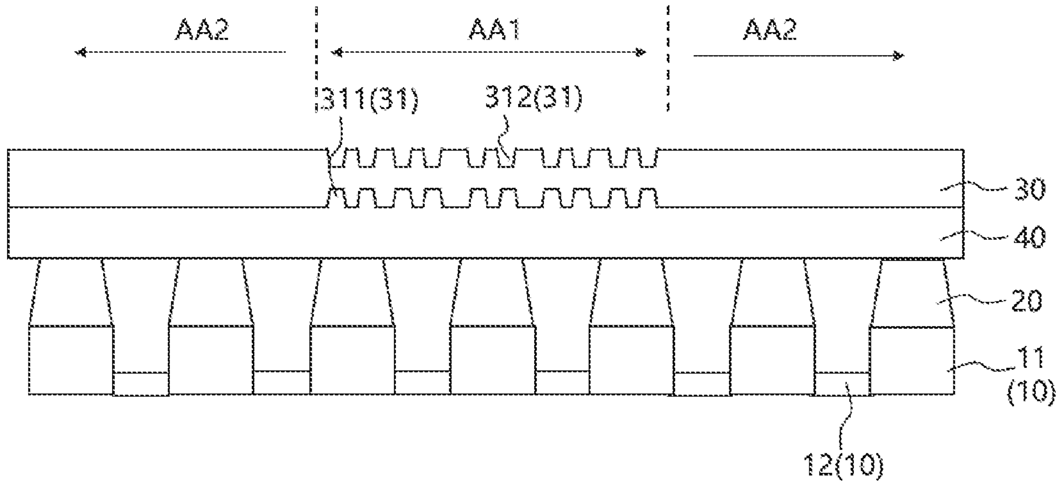
FIG. 5 is a schematic view illustrating a third cross-sectional structure of the display panel provided in the first embodiment of the present application.

Please refer to FIGS. 1 to 5, where FIG. 1 is a schematic top view of a second substrate of a display panel according to a first embodiment of the present application; FIG. 2 is a schematic top view of a first substrate of the display panel provided in the first embodiment of the present application; FIG. 3 is a schematic view illustrating a first cross-sectional structure of the display panel provided in the first embodiment of the present application; FIG. 4 is a schematic view illustrating a second cross-sectional structure of the display panel provided in the first embodiment of the present application; and FIG. 5 is a schematic view illustrating a third cross-sectional structure of the display panel provided in the first embodiment of the present application.

The present application provides a display panel 100, which includes a first display area AA1 and a second display area AA2 surrounding the first display area AA1. The display panel 100 includes a first substrate 10, a plurality of light-emitting elements 20, and a second substrate 30. The first substrate 10 includes a plurality of base islands 11; a plurality of light-emitting elements 20 are disposed on the first substrate 10; the second substrate 30 is disposed on the light-emitting elements 20; wherein the second substrate 30 includes a plurality of grooves 31, and grooves 31 are arranged in the first display area AA1.

Specifically, as shown in FIG. 1, the display panel 100 includes the first display area AA1 and the second display area AA2 surrounding the first display area AA1. The first display area AA1 is a central part of the display panel 100, and the second display area AA2 is a peripheral display part of the display panel, surrounding the first display area AA1.

Specifically, as shown in FIG. 2, the first substrate 10 includes the base islands 11, and the adjacent base islands 11 are connected through connection segments 12. The first substrate 10 can be patterned to form the base islands 11 and the connection segments 12.

Specifically, the light-emitting elements 20 are arranged on the first substrate 10, and the light-emitting elements 20 can be disposed on the corresponding base islands 11.

Specifically, pixel driving circuits and thin-film transistors that drive the light-emitting elements can be set on the first substrate 10, and the present application is not limited in this regard.

Specifically, light-emitting elements can be micro light-emitting diodes (Micro LED, Mini LED) or organic light-emitting devices (OLED light-emitting devices).

Specifically, when the light-emitting elements are micro light-emitting diodes (Micro LED, Mini LED), the first substrate 10 is set with pad terminals for electrical connection with the light-emitting elements, and the light-emitting elements are welded to the pad terminals.

Specifically, as shown in FIGS. 3 to 5, the second substrate 30 includes the grooves 31, and the grooves 31 are arranged in the first display area AA1.

Specifically, the second substrate 30 is a stretch film, and the second substrate 30 can be attached to the light-emitting elements 20 through an adhesive layer 40. A material of the second substrate 30 can be polydimethylsiloxane (PDMS).

In the present embodiment, the grooves 31 are arranged in the first display area AA1 (the central part) of the second substrate 30 (the stretch film). The grooves 31 can increase the elasticity and stretchability of the second substrate 30 in the first display area AA1, making the stretch film in the first display area AA1 easy to stretch and deform, reducing stress concentration. This ensures that when the display panel 100 is stretched upwards, the central part is not subjected to excessive force and deformation leading to stress concentration, allowing the first display area AA1 to be smoothly stretched. This can improve and avoid uneven display effects and abnormal screen issues.

In some embodiments, the grooves 31 include a plurality of first grooves 311, and the first grooves 311 are set on a surface of the second substrate 30 facing the light-emitting elements 20.

Specifically, as shown in FIG. 3, the first grooves 311 are set on the surface of the second substrate 30 facing the light-emitting elements 20, ensuring the smoothness of a surface of the second substrate 30 facing away from the light-emitting elements 20.

In some embodiments, the grooves 31 also include a plurality of second grooves 312, and the second grooves 312 are arranged on the surface of the second substrate 30 facing away from the light-emitting elements 20.

Specifically, as shown in FIG. 4, the second grooves 312 are arranged on the surface of the second substrate 30 facing away from the light-emitting elements 20. This makes the surface of the second substrate 30 facing the light-emitting elements 20 smooth, eliminating the need to consider the flattening of the first grooves 311 by the adhesive layer 40. This can reduce a thickness of the adhesive layer 40, benefiting the lightness and thinness of the display panel 100.

In some embodiments, as shown in FIG. 5, the display panel 100 includes both the first grooves 311 and the second grooves 312. In a thickness direction of the second substrate 30, the first grooves 311 overlap with the second grooves 312.

Specifically, as shown in FIG. 5, the display panel 100 includes both the first grooves 311 and the second grooves 312. This can avoid uneven force and stress on the two surfaces of the second substrate 30 when the display panel is stretched, ensuring that when the display panel 100 is stretched upwards, the central part is not subjected to excessive force and deformation leading to stress concentration. This allows the first display area AA1 to be smoothly stretched, improving and avoiding uneven display effects and abnormal screen issues.

Specifically, as shown in FIG. 5, the overlapping setting of the first grooves 311 and the second grooves 312 can further reduce the thickness of the second substrate 30 at the grooves 31, better increasing the elasticity and stretchability of the second substrate 30 in the first display area AA1.

In some embodiments, as shown in FIG. 5, the first grooves 311 and the second grooves 312 have the same shape. For example, in a top view, both the first grooves 311 and the second grooves 312 are circular, better ensuring even force and deformation on the two surfaces of the second substrate 30 when stretched; preferably, the first grooves 311 and the second grooves 312 are symmetrically arranged facing each other.

In some embodiments, parallel to a plane of the display panel 100, the length of the grooves 31 is less than the length of the light-emitting elements 20.

Specifically, as shown in FIGS. 3 to 5, along a direction parallel to the plane of the display panel 100, a length of the groove 31 is less than a length of the light-emitting element 20. While increasing the elasticity and stretchability of the second substrate 30 in the first display area AA1, this helps to prevent a decrease in the performance of the second substrate 30 in supporting the light-emitting elements 20 and avoids abnormal stretching of areas corresponding to individual light-emitting elements due to the arrangement of the grooves 31 when the second substrate 30 is stretched.

In some embodiments, depths of the grooves 31 are in a range of 1-10 micrometers, and a thickness range of the second substrate 30 is 100-500 micrometers. This prevents a decrease in the performance of the second substrate 30 in supporting the light-emitting elements 20 due to an excessive depth of the grooves 31.

In some embodiments, in a top view, the shape of the groove 311 is at least one of a rectangle, rhombus, circle, semicircle, and triangle.

Second Embodiment

Figure 6:
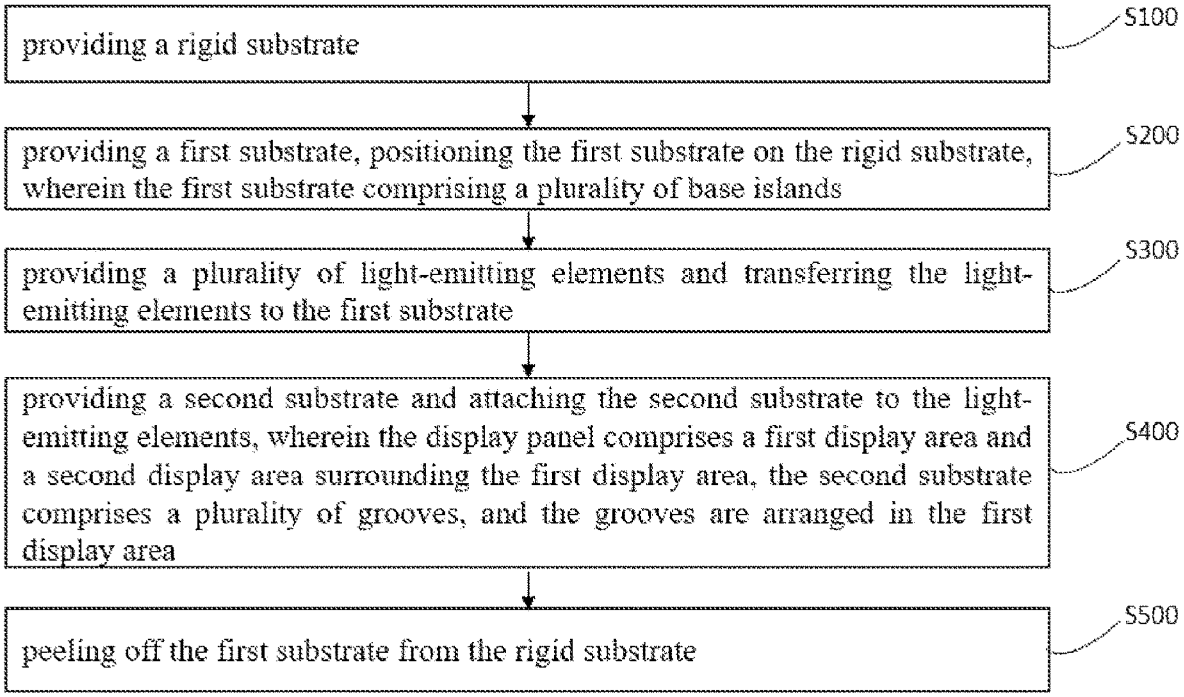
FIG. 6 is a process flow diagrams showing a manufacturing method of a display panel according to a second embodiment of the present application.
Figure 7:
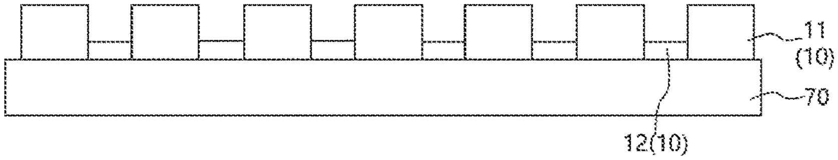
FIG. 7 is a schematic view of a first intermediate process of the manufacturing method of the display panel according to the second embodiment of the present application.
Figure 8:
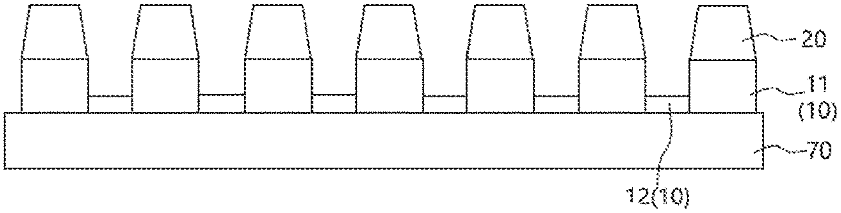
FIG. 8 is a schematic view of a second intermediate process of the manufacturing method of the display panel according to the second embodiment of the present application.
Figure 9:
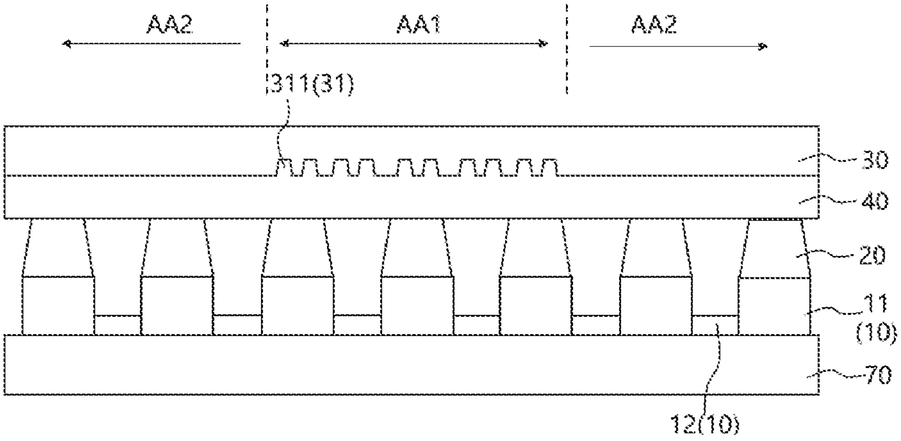
FIG. 9 is a schematic view of a third intermediate process of the manufacturing method of the display panel according to the second embodiment of the present application.

Please refer to FIGS. 6 to 9. FIG. 6 is a process flow diagram for a manufacturing method of a display panel according to the second embodiment of this application. FIG. 7 is a schematic view of a first intermediate process of the manufacturing method of the display panel according to the second embodiment of the present application. FIG. 8 is a schematic view of a second intermediate process of the manufacturing method of the display panel according to the second embodiment of the present application. FIG. 9 is a schematic view of a third intermediate process of the manufacturing method of the display panel according to the second embodiment of the present application.

Any of the display panels 100 in the above embodiments can be manufactured using the manufacturing method of this embodiment.

The present application provides a manufacturing method for a display panel, which includes the following steps: S100, S200, S300, S400, S500.

S100: providing a rigid substrate 70.

Specifically, as shown in FIG. 7, the rigid substrate 70 is provided, which can be a glass substrate.

S200: providing a first substrate 10, the first substrate 10 disposed on the rigid substrate 70, wherein the first substrate 10 includes a plurality of base islands 11.

Specifically, as shown in FIG. 7, the first substrate 10 is provided and disposed on the rigid substrate 70. The first substrate 10 includes the base islands 11.

S300: providing a plurality of light-emitting elements and transferring the light-emitting elements to the first substrate 10.

Specifically, as shown in FIG. 9, the light-emitting elements 20 are provided and transferred to the first substrate 10.

S400: As shown in FIG. 9, providing a second substrate 30 and attaching the second substrate 30 to the light-emitting elements 20. The display panel includes a first display area AA1 and a second display area AA2 surrounding the first display area AA1. The second substrate 30 includes a plurality of grooves 31 which are arranged in the first display area AA1.

S500: peeling off the first substrate 10 from the rigid substrate 70.

Specifically, the first substrate 10 is peeled off from the rigid substrate 70, resulting in the display panel 100 as described in any of the embodiments above.

In some embodiments, parallel to a plane of the display panel 100, a length of the groove 31 is less than a length of the light-emitting element 20.

Specifically, the grooves 31 can be manufactured using methods such as embossing or micro-perforation embossing.

The manufacturing method for the display panel in this embodiment results in a display panel that is the same as the one in any of the aforementioned embodiments and has the same structure and effects, which are not reiterated here.

The above has been a detailed introduction to a display panel and manufacturing method thereof provided in the embodiments of this application. Specific examples have been used in this document to explain the principles and implementation methods of this application. The description of the above embodiments is only used to help understand the methods of this application and its core ideas. At the same time, for those skilled in the art, according to the ideas of this application, there will be changes in specific implementation methods and application scopes. In summary, the content of this specification should not be construed as limiting this application.

What is claimed is:

1. A display panel, comprising a first display area and a second display area surrounding the first display area, the display panel comprising:

a first substrate comprising a plurality of base islands;

a plurality of light-emitting elements disposed on the first substrate; and a second substrate disposed on the light-emitting elements;

wherein the second substrate comprises a plurality of grooves, and the grooves are arranged in the first display area.

2. The display panel according to claim 1, wherein the grooves comprise a plurality of first grooves, and the first grooves are defined in a surface of the second substrate facing the light-emitting elements.

3. The display panel according to claim 2, wherein the grooves further comprise a plurality of second grooves, and the second grooves are defined in a surface of the second substrate away from the light-emitting elements.

4. The display panel according to claim 3, wherein the first grooves and the second grooves overlap in a thickness direction of the second substrate.

5. The display panel according to claim 4, wherein a shape of each of the first grooves is same as a shape of a corresponding one of the second grooves.

6. The display panel according to claim 1, wherein a length of each of the grooves is less than a length of each of the light-emitting elements along a horizontal direction parallel to a plane surface of the display panel.

7. The display panel according to claim 1, wherein a depth of each of the grooves ranges from 1 to 10 micrometers.

8. The display panel according to claim 1, wherein in a top view, a shape of the groove is at least one of a rectangle, a rhombus, a circle, a semicircle, and a triangle.

9. A manufacturing method of a display panel, comprising:

providing a rigid substrate;

providing a first substrate, positioning the first substrate on the rigid substrate, wherein the first substrate comprising a plurality of base islands;

providing a plurality of light-emitting elements and transferring the light-emitting elements to the first substrate;

providing a second substrate and attaching the second substrate to the light-emitting elements, wherein the display panel comprises a first display area and a second display area surrounding the first display area, the second substrate comprises a plurality of grooves, and the grooves are arranged in the first display area; and peeling off the first substrate from the rigid substrate.

10. The manufacturing method of the display panel according to claim 9, wherein a length of each of the grooves is smaller than a length of each of the light-emitting elements along a horizontal direction parallel to a plane surface of the display panel.

* * * * *